United States Patent
Murata

(10) Patent No.: US 7,981,804 B2
(45) Date of Patent: Jul. 19, 2011

(54) MANUFACTURING METHOD OF SEMICONDUCTOR DEVICE

(75) Inventor: Michihiro Murata, Chiba (JP)

(73) Assignee: Seiko Instruments Inc. (JP)

( * ) Notice: Subject to any disclaimer, the term of this patent is extended or adjusted under 35 U.S.C. 154(b) by 81 days.

(21) Appl. No.: 12/364,908

(22) Filed: Feb. 3, 2009

(65) Prior Publication Data

US 2009/0203210 A1      Aug. 13, 2009

(30) Foreign Application Priority Data

Feb. 8, 2008 (JP) .................................. 2008-028703

(51) Int. Cl.
*H01L 21/302*      (2006.01)

(52) U.S. Cl. ........ 438/712; 438/637; 438/669; 438/695; 438/706; 438/733; 257/774; 257/E21.218; 257/E21.221; 257/E21.222

(58) Field of Classification Search .................. 438/669, 438/637, 712, 695, 706, 733; 257/E21.486, 257/E23.141, 774, E21.218, E21.221, E21.222
See application file for complete search history.

(56) References Cited

U.S. PATENT DOCUMENTS

| | | | | |
|---|---|---|---|---|
| 5,578,163 A | * | 11/1996 | Yachi | 438/696 |
| 2006/0261427 A1 | * | 11/2006 | Dillon et al. | 257/432 |
| 2007/0132105 A1 | * | 6/2007 | Akram et al. | 257/774 |
| 2007/0187362 A1 | * | 8/2007 | Nakagawa et al. | 216/58 |
| 2009/0085120 A1 | * | 4/2009 | Lu et al. | 257/368 |

FOREIGN PATENT DOCUMENTS

| | | | |
|---|---|---|---|
| JP | 63-250823 A | | 10/1988 |
| JP | 63250823 | * | 10/1988 |
| JP | 7-45590 A | | 2/1995 |

* cited by examiner

*Primary Examiner* — Benjamin P Sandvik
*Assistant Examiner* — Farid Khan
(74) *Attorney, Agent, or Firm* — Brinks Hofer Gilson & Lione

(57) ABSTRACT

A method of forming a metal interconnection that has a favorable cross-sectional shape is provided without the fear of side etching, even in a sparse arrangement of metal interconnections. The method, the following structure is employed. A region for placing a dummy metal interconnection is provided close to a region in which a metal interconnection is formed. A trench is formed in the dummy metal interconnection region and a resist pattern for the metal interconnection is then formed, giving the resist above the trench a large surface area per unit area. The metal interconnection is subsequently formed by dry etching in which an organic component from the resist above the trench forms a solid sidewall protection film, permitting anisotropic etching. The metal interconnection can thus have a favorable cross-sectional shape.

7 Claims, 3 Drawing Sheets

MANUFACTURING METHOD OF SEMICONDUCTOR DEVICE

RELATED APPLICATIONS

This application claims priority under 35 U.S.C. §119 to Japanese Patent Application No. JP2008-028703 filed on Feb. 8, 2008, the entire content of which is hereby incorporated by reference.

TECHNICAL FIELD

The present invention relates to a method of manufacturing a semiconductor device, more particularly, to an etching method for metal interconnection.

BACKGROUND ART

In a dry etching process of aluminum, decomposed resist material supplied from resist contributes to a formation of sidewall protection film which is known to permit anisotropic micro-processing. Chlorine-based gases such as Cl2, BCl3, and HCL are typical for the etching. Aluminum, which is a highly reactive metal, reacts vigorously with Cl2 molecules and is etched rapidly. The formation of protection film on the sidewall of a pattern is thus necessary in order to suppress undercut. A fine pattern with a high resist opening ratio, however, causes lack of the decomposed resist material to form sufficient sidewall protection films, leading to occurrence of undercut during the etching, which results in failure in maintaining the anisotropy of the etched aluminum. Consequently, decrease in interconnection reliability and breaking of interconnection may occur.

A countermeasure for the drawback is known, as disclosed in Patent Document 1, to form a dummy resist pattern separately from a device pattern on the same wafer, whereby the increased resist amount supplements the decomposed resist material and keeps the anisotropy of the aluminum. Another method is known, as disclosed in Patent Document 2, to introduce an impurity that forms a sidewall protection film in aluminum etching, for example, element boron, into an aluminum film in advance.

Patent Document 1 JP 63-250823 A
Patent Document 2 JP 07-45590 A

Resist opening ratio can be high in some semiconductor devices or ICs because of their characteristics. Besides, further shrinking of a chip size is expected to reduce the degree of freedom in interconnection layout and to make it difficult to form a large dummy pattern covered with resist. A large dummy pattern can only be formed at a location apart from the interconnection pattern, causing a problem in which the decomposed resist material may exert little effect to the formation of the sidewall protection film. The micro-loading effect also raises a problem in that the decomposed resist material cannot be supplied to a fine interconnection pattern, inhibiting the formation of the aluminum sidewall protection film during etching, and making anisotropic etching of aluminum difficult.

SUMMARY OF THE INVENTION

An object of the present invention is to provide a method of manufacturing a semiconductor device, in which anisotropic etching of aluminum is enabled by placing a supply source of a decomposed resist material near an interconnection pattern without forming a large dummy pattern.

To attain the above-mentioned object, according to the present invention, a method of manufacturing a semiconductor device that has a metal interconnection on a semiconductor substrate is characterized by including the steps of: forming an interlayer insulating film on the semiconductor substrate; forming a trench in the insulating film and the semiconductor substrate; forming by deposition a metal film on the interlayer insulating film and the trench; forming a resist pattern on the metal film; and etching the metal film to form a metal interconnection on the interlayer insulating film and a dummy metal interconnection above the trench close to each other.

Further, the method of manufacturing a semiconductor device is characterized in that, in the step of forming a resist pattern on the metal film, a part of resist above the trench is exposed to light to reduce a thickness of the resist film.

Further, the method of manufacturing a semiconductor device is characterized in that the exposed region of the resist above the trench is circular or quadrangular in plan view.

With the above-mentioned method of manufacturing a semiconductor device, in forming interconnection metal by dry etching, the surface area of resist disposed on a trench close to an interconnection is large with respect to a side surface of the interconnection exposed by the etching. An organic component is therefore supplied from the resist disposed on the trench to form the sidewall protection film, thus ensuring successful anisotropic etching without fear for side etching. Accordingly, a metal interconnection having a favorable cross-sectional shape can be formed.

DETAILED DESCRIPTION OF THE PREFERRED EMBODIMENTS

Embodiments of the present invention are described below with reference to FIGS. 1A to 1D and FIGS. 2A and 2B.

FIGS. 1A to 1D are process step sectional views illustrating a first embodiment of the present invention.

Figure 1A:
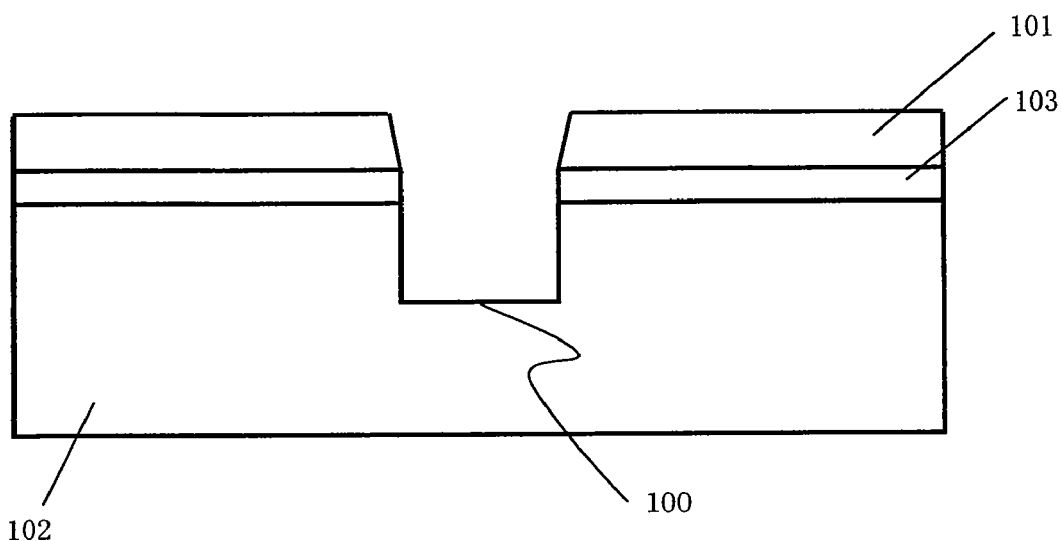
FIG. 1A is a process step sectional view according to a first embodiment of the present invention that illustrates a state after trench etching.

Illustrated in the sectional view of FIG. 1A is a step in which a semiconductor element is formed on a semiconductor substrate 102, specifically, a step in which a trench 100 is formed after a contact hole of the semiconductor element is formed. An interlayer insulating film 103 is formed on the semiconductor substrate 2, and resist 101 is applied onto the interlayer insulating film. The resist 101 is patterned to be used as a mask in forming the trench 100, which is an opening, in the underlying interlayer insulating film 103 and semiconductor substrate 102 by etching. In the case of a semiconductor element that does not have a trench structure the trench 100 is formed with the use of one additional mask after the formation of a contact hole as in this embodiment. In the case of a semiconductor element that has a trench structure, the trench 100 can be formed without adding a mask pattern.

Figure 1B:
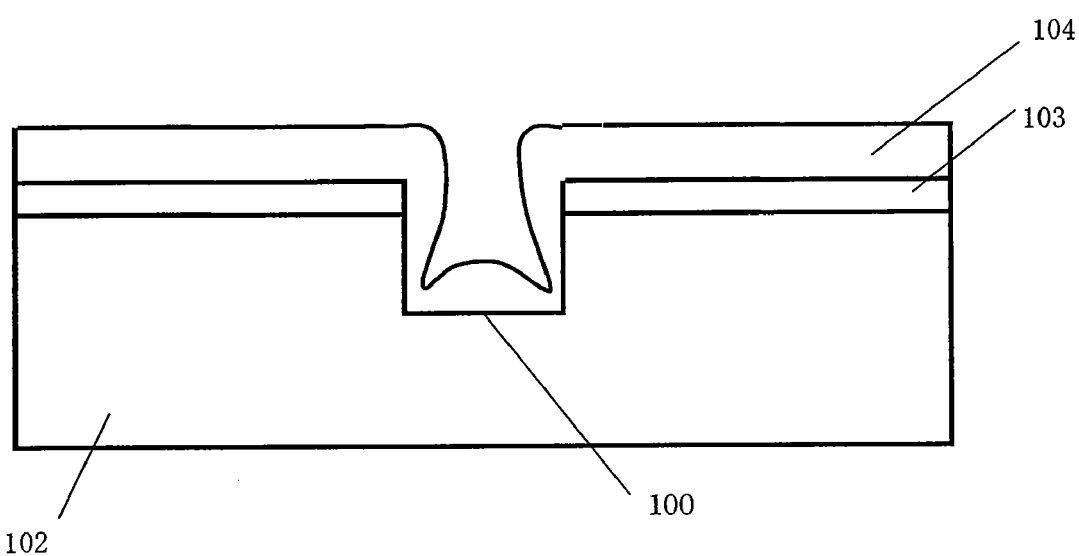
FIG. 1B is a process step sectional view according to the first embodiment of the present invention that illustrates a state after a metal film is formed by deposition.

FIG. 1B is a process step sectional view illustrating a state in which the resist has been removed and a metal film 104 has been formed by deposition on the interlayer insulating film 103 and inside the trench 100. The metal film 104 later forms a metal interconnection and a dummy metal interconnection, and is made of, for example, aluminum alloy that is pure aluminum containing silicon or copper.

Figure 1C:
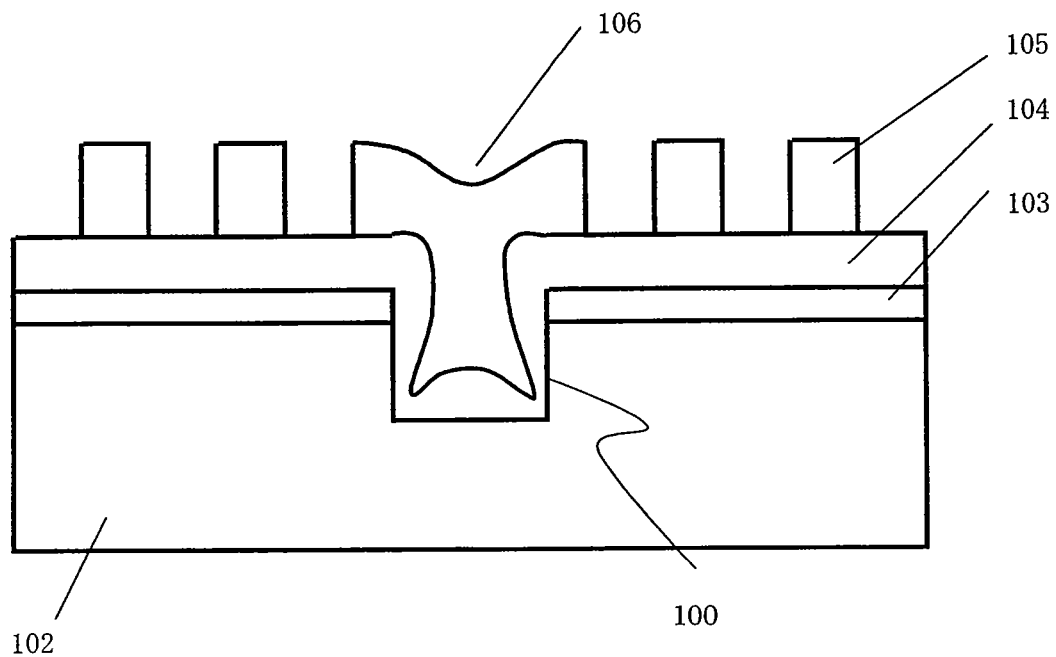
FIG. 1C is a process step sectional view according to the first embodiment of the present invention that illustrates a state after resist is patterned.

FIG. 1C is a process step sectional view in which resist that is used as a mask for dry etching of the metal film has been patterned. The resist 105 is formed on the metal film 104. The inside of the trench 100 is also filled with resist 106, giving a concave profile to the top surface, and the profile gives the resist 106 a larger surface area per unit area than a resist pattern formed on a flat surface.

Though the concave profile of the resist 106 in the trench varies depending on the shape of the trench and conditions under which the resist is applied, the surface area of the concave is preferred to be large. Diameter (span) of the trench opening is desirably more than twice of the total film thickness of the metal film and the resist film, and has an aspect ratio of 1 to 3. The resist is desirably applied to the metal film 104 inside the trench conformally. Applying the resist by spray coating produces a resist shape that reflects the interior shape of the trench better than spin coating.

Figure 1D:
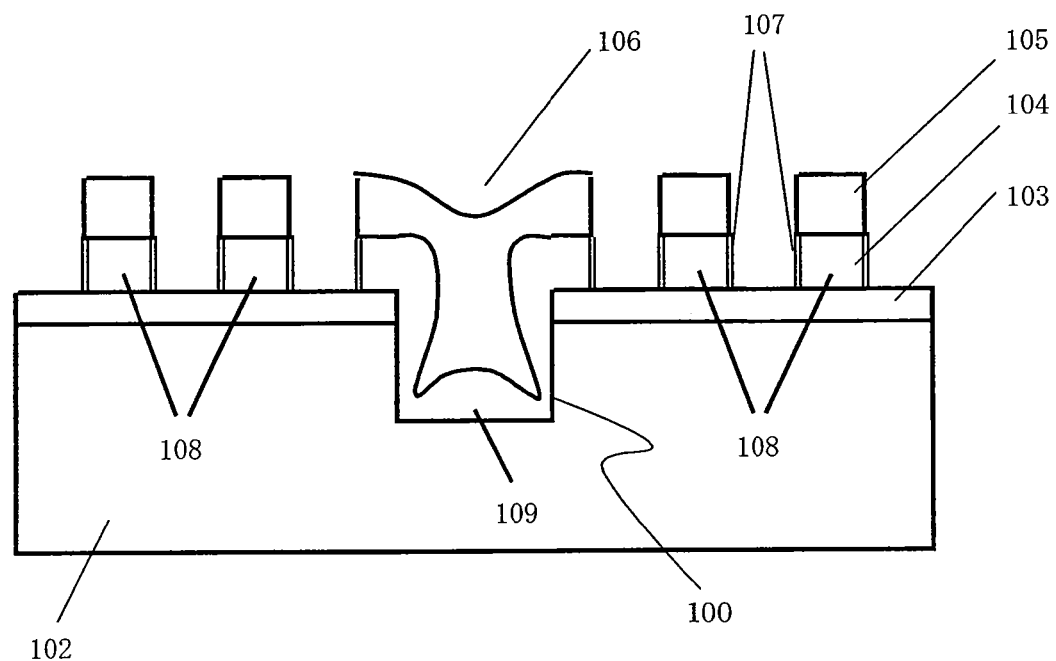
FIG. 1D is a process step sectional view according to the first embodiment of the present invention that illustrates a state after dry etching of the metal film.

FIG. 1D is a process step sectional view in which dry etching of the metal film has been finished. Using the resist 105 and 106 as a mask the metal film 104 is etched to form a metal interconnection 108 and a dummy metal interconnection 109 close to each other. The side surfaces of the metal interconnection 108 and the dummy metal interconnection 109 are covered with sidewall protection films 107. The sidewall protection films 107 are formed through adhesion of organic components that are generated by decomposition of the resist 105 and 106 during the etching of the metal film 104.

In a conventional structure the sidewall protection films 107 do not have a sufficient thickness and side etching occurs in a sparse arrangement of the metal interconnections 108 since absence of the trench 100 causes no supply of organic components from the resist 106 having a concave profile. In the present invention, on the other hand, trenches are arranged in the vicinity of the metal interconnections to supply organic components to coat with sufficiently thick sidewall protection films 107 when metal interconnections have a sparse arrangement, no side etching occurs and the metal interconnections 108 can have a favorable cross-sectional shape.

A modified example of the above-mentioned embodiment, in which the resist 106 covers the trench 100, is described next.

Figure 2A:
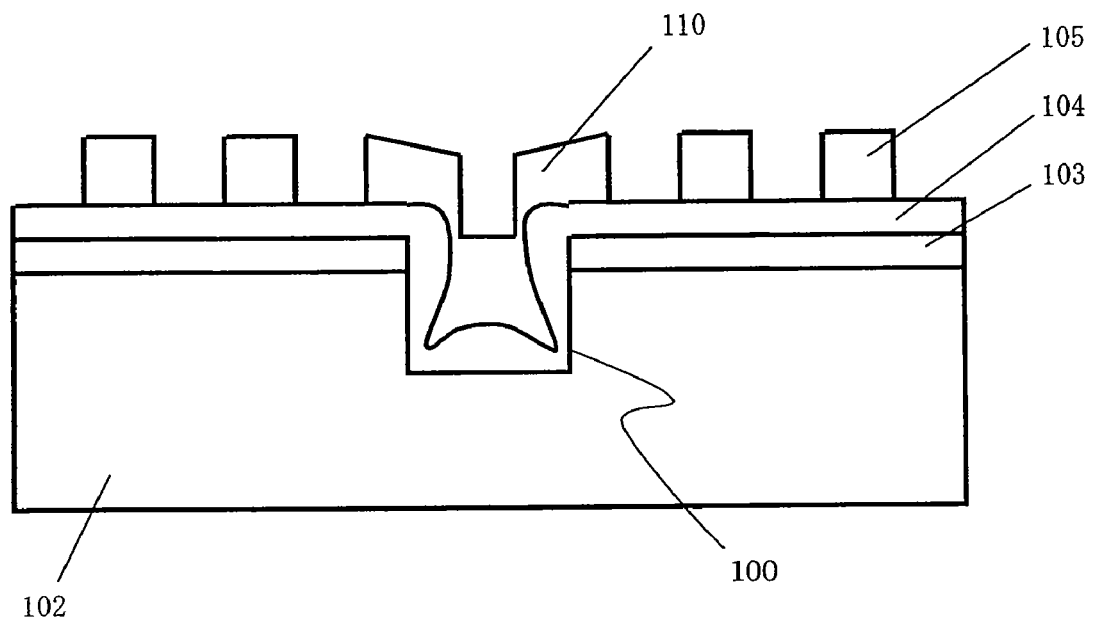
FIG. 2A is a process step sectional view according to a second embodiment of the present invention that illustrates a state after resist is patterned.
Figure 2B:
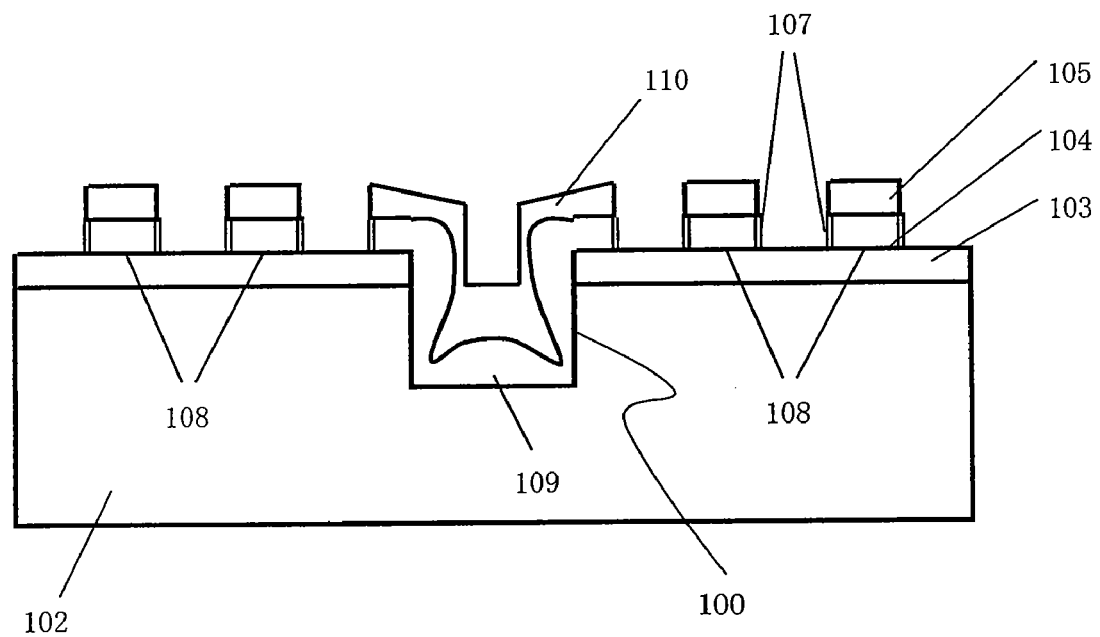
FIG. 2B is a process step sectional view according to the second embodiment of the present invention that illustrates a state after dry etching of a metal film.

FIGS. 2A and 2B are process step sectional views illustrating a second embodiment of the present invention.

The step of FIG. 2A follows FIGS. 1A and 1B. FIG. 2A differs from FIG. 1C in that a small hole is provided in resist 110 formed above the trench 100. Disposing a hole smaller than the area of the metal film opening in the trench at the center of the resist 110 in resist patterning gives the resist 110 an even larger surface area. The small hole can be formed simultaneously in the exposure for patterning the resist 105 and 106. Preferably, the exposure amount is adjusted so that the resist remains on the bottom of the opening at the center of the resist 106.

In this way, various patterning, which is made on the resist above the trench in the resist patterning for formation of the interconnection, can increase the surface area of the resist drastically. Though not illustrated in the drawing, the small hole formed in the resist 110 is circular when viewed from above. Alternatively, the small hole may be quadrangular or may have a shape constituted of a plurality of circles or a plurality of quadrangles. With the above-mentioned method, resist having a sufficient surface area can be formed even when spin coating is employed to apply the resist.

FIG. 2B is a process step sectional view in which dry etching of the metal film has been finished. Using the resist 105 and 110 as a mask the metal film 104 is etched to form the metal interconnection 108 and the dummy metal interconnection 109 close to each other. The side surfaces of the metal interconnection 108 and the dummy metal interconnection 109 are covered with the sidewall protection films 107. The sidewall protection films 107 are formed through adhesion of organic components that are generated by decomposition of the resist 105 and 110 during the etching of the metal film 104.

In a conventional structure the sidewall protection films 107 do not have a sufficient thickness and side etching occurs in a sparse arrangement of the metal interconnections 108 since absence of the trench 100 causes no supply of organic components from the resist 106 having a concave profile. In the present invention, on the other hand, trenches are arranged in the vicinity of the metal interconnections to supply organic components to coat with sufficiently thick sidewall protection films 107 when metal interconnections have a sparse arrangement, no side etching occurs and the metal interconnections 108 can have a favorable cross-sectional shape.

As has been described above, a manufacturing method of the present invention ensures a sidewall protection film that has a sufficient thickness, thereby inhibiting side etching during etching. A metal interconnection free from the fear of lowered reliability can thus be formed.

The invention claimed is:

1. A method of manufacturing a semiconductor device having a metal interconnection on a semiconductor substrate, comprising the steps of:
   forming an interlayer insulating film on the semiconductor substrate;
   forming a trench in the interlayer insulating film and the semiconductor substrate for forming a dummy metal interconnection, the trench having an opening whose diameter is twice or longer of a total film thickness of a metal film and a resist film the diameter having an aspect ratio in the range of 1 to 3;
   forming a metal film on a surface of the interlayer insulating film and inside the trench by deposition;
   forming a pattern with a resist on the metal film; and
   etching the metal film to form the metal interconnection on the interlayer insulating film and the dummy metal interconnection inside and around the trench close to each other.

2. A method of manufacturing a semiconductor device according to claim 1, wherein; in the step of forming a pattern with a resist on the metal film, a part of the resist above the trench is exposed to reduce a thickness of the resist film.

3. A method of manufacturing a semiconductor device according to claim 2, wherein; the exposed part of the resist above the trench is circular in plan view.

4. A method of manufacturing a semiconductor device according to claim 2, wherein; the exposed part of the resist above the trench is quadrangular in plan view.

5. A method of manufacturing a semiconductor device according to claim 3, wherein; a plurality of the circular exposed part of the resist is formed above a single trench.

6. A method of manufacturing a semiconductor device according to claim 4, wherein; a plurality of the quadrangular exposed part of the resist is formed above a single trench.

7. A method of manufacturing a semiconductor device according to claim 1, wherein; the metal film is formed from aluminum, or an aluminum alloy containing one out of silicon and copper.

* * * * *

UNITED STATES PATENT AND TRADEMARK OFFICE
CERTIFICATE OF CORRECTION

| | |
|---|---|
| PATENT NO. | : 7,981,804 B2 |
| APPLICATION NO. | : 12/364908 |
| DATED | : July 19, 2011 |
| INVENTOR(S) | : Michihiro Murata et al. |

It is certified that error appears in the above-identified patent and that said Letters Patent is hereby corrected as shown below:

In column 4, claim 1, line 49, immediately after "metal film and a resist film" insert --,--.

Signed and Sealed this
Twenty-second Day of November, 2011

David J. Kappos
*Director of the United States Patent and Trademark Office*